(12) United States Patent
Mathieson et al.

(10) Patent No.: US 6,540,091 B2
(45) Date of Patent: Apr. 1, 2003

(54) SUPPORT UNIT FOR STACKED ITEMS

(75) Inventors: Peter Craig Mathieson, Kanata (CA); Chris Gorman, Ottawa (CA)

(73) Assignee: Mitel Knowledge Corporation, Kanata (CA)

( * ) Notice: Subject to any disclaimer, the term of this patent is extended or adjusted under 35 U.S.C. 154(b) by 0 days.

(21) Appl. No.: 09/808,682

(22) Filed: Mar. 15, 2001

(65) Prior Publication Data

US 2001/0025822 A1 Oct. 4, 2001

(30) Foreign Application Priority Data

Mar. 17, 2000 (GB) .............................................. 0006554

(51) Int. Cl.$^7$ ................................................. A47F 7/00
(52) U.S. Cl. ....................................... 211/26; 211/49.1
(58) Field of Search ........................ 211/26, 194, 49.1, 211/41.1, 40; 248/694, 49, 68.1, 674, 675, 201

(56) References Cited

U.S. PATENT DOCUMENTS

| | | | | |
|---|---|---|---|---|
| 3,746,290 A | * | 7/1973 | Sholtes | 248/15 |
| 3,811,747 A | | 5/1974 | Levin | |
| 4,846,435 A | * | 7/1989 | Cohen | 248/346 |
| 4,898,354 A | * | 2/1990 | Whittington et al. | 248/225.1 |
| 5,246,129 A | | 9/1993 | Small et al. | |
| 5,295,653 A | * | 3/1994 | Miyazaki et al. | 248/675 |
| 5,299,690 A | * | 4/1994 | Mund et al. | 211/194 |
| 5,333,098 A | | 7/1994 | DeLuca et al. | |
| 5,435,516 A | * | 7/1995 | Ogasawara et al. | 248/635 |
| 5,586,666 A | | 12/1996 | Squitieri | |
| 5,622,270 A | * | 4/1997 | Bezos | 211/89 |
| 6,047,936 A | * | 4/2000 | Favotto et al. | 248/309.1 |
| 6,170,784 B1 | * | 1/2001 | MacDonald et al. | 248/65 |
| 6,171,540 B1 | * | 1/2001 | Ibaragi | 248/674 |
| 2001/0048053 A1 | * | 12/2001 | Donoho | 248/68.1 |

FOREIGN PATENT DOCUMENTS

DE  3633213 A1  3/1988

* cited by examiner

Primary Examiner—Daniel P. Stodola
Assistant Examiner—Jennifer E. Novosad
(74) Attorney, Agent, or Firm—Keating & Bennett, LLP

(57) ABSTRACT

A support unit includes an outer panel intended to lie in a vertical plane when in use, the outer panel having a straight, horizontal lower edge. The support unit further includes an inner panel extending generally at right angles to the outer panel and connected thereto along a portion of the lower edge of the outer panel which is adjacent one end of that edge. The inner panel has structure defining a first horizontal contact plane on the upper side of the inner panel, and a second horizontal contact plane on the lower side of the inner panel. These two planes are substantially parallel. The preferred embodiment further includes a flange adjacent the mid-region of the outer panel and extending generally parallel with the two contact planes. In the preferred embodiment, the flange is flat and has a top surface which contains a hypothetical line extending at right angles to the outer panel. The support unit is such that a pair of them, with one rotated about the hypothetical line through 180° with respect to the other, can be fitted together with the hypothetical lines coincident, the flanges in surface contact, the lower edges of the outer panel in aligned contact, and the first contact plane of each support unit coplanar with the second contact plane of the other support unit, whereby a single support unit alone can provide a load-bearing foot with which to support at least part of the overall weight of a stack of such items, while a pair of support units in rotated juxtaposition about their hypothetical lines can provide an interstitial spacer between two stacked items. The flange has a detent which interacts with a further detent on the outer panel of the second support unit, in such a way as to restrain the support units from disengaging.

5 Claims, 2 Drawing Sheets

SUPPORT UNIT FOR STACKED ITEMS

This invention relates generally to the construction of electronics enclosures, and has to do particularly with the means utilized to support a stack of enclosures both interstitially and from underneath.

PRIOR ART

In prior constructions for stacked electronics enclosures, the interstitial supports and the mounting "feet" under the bottom enclosure were of different designs, requiring two different designs to be conceived, manufactured and warehoused. It is generally conceded that a major breakthrough in design would be achieved if a single construction could be utilized for both the mounting feet and the interstitial stacking supports.

GENERAL DESCRIPTION OF THIS INVENTION

Accordingly, it is an object of one aspect of this invention to provide a single design which will fulfill all requirements for a foot mounting part and a stacking part.

More particularly, this invention provides a support unit comprising:

a) an outer panel adapted to lie substantially in a vertical plane when in use, the outer panel having a substantially straight, horizontal lower edge with two ends, and b) an inner panel extending generally at right-angles to the outer panel and connected thereto along a portion of said edge which is adjacent one end of the edge; the inner panel having first means defining a first horizontal contact plane on the upper side of the inner panel, and having second means defining a second horizontal contact plane on the lower side of the inner panel, the two planes being substantially parallel, whereby said support unit can be affixed to an item which has a bottom wall intended to be horizontal, such that said first means supports said bottom wall while said second means rests against a substantially horizontal supporting surface.

GENERAL DESCRIPTION OF THE DRAWINGS

One embodiment of this invention is illustrated in the accompanying drawings, in which like numerals denote like parts throughout the several views, and in which.

DETAILED DESCRIPTION OF THE DRAWINGS

Figure 1:
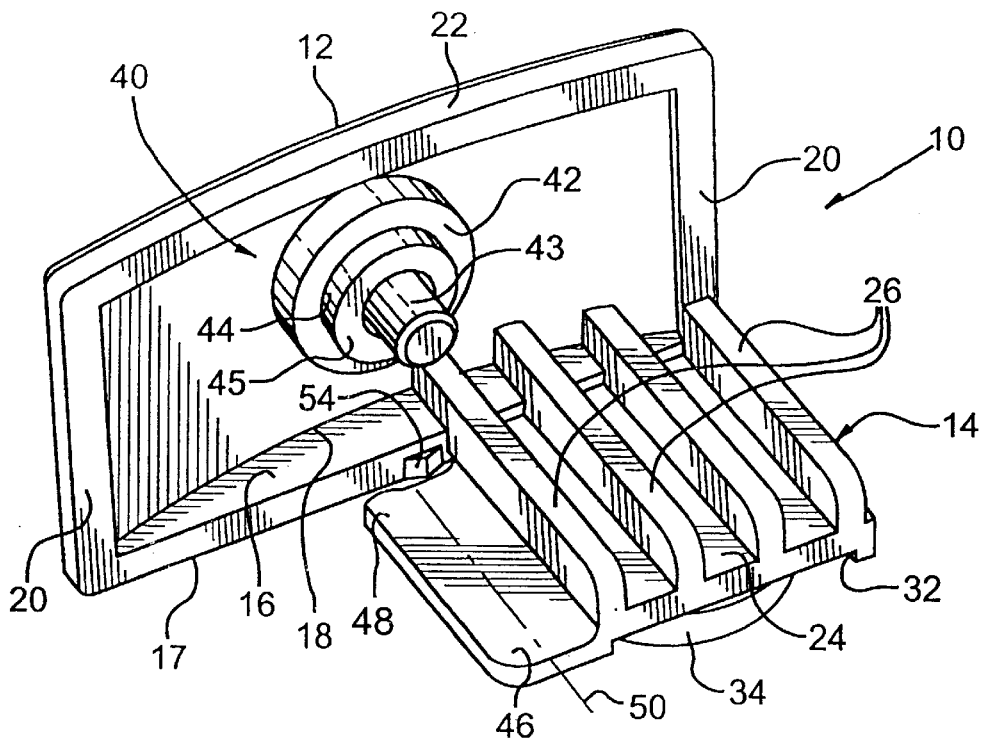
FIG. 1 is a perspective view of a single unit which can be used alone as a mounting foot or can be used with another similar unit to provide an interstitial spacer and rigidifier.

Attention is first direct to FIG. 1, which shows a support unit 10, having essentially an outer panel 12 and an inner panel 14.

The outer panel 12 includes a lower frame member 16 which has a rectilinear lower edge 17 when viewed in elevation (as in FIG. 5) but has a curved outer edge 18 when seen in perspective (as in FIG. 1).

The outer panel 12 further incorporates upstanding, rectilinear side frame members 20, and an upwardly arched upper frame member 22.

The inner panel 14 extends generally at right-angles to the outer panel 12, and is connected thereto along the rightward portion of the lower frame member 16 (i.e., along the rightward part of the lower edge 17 of the outer panel).

Figure 5:
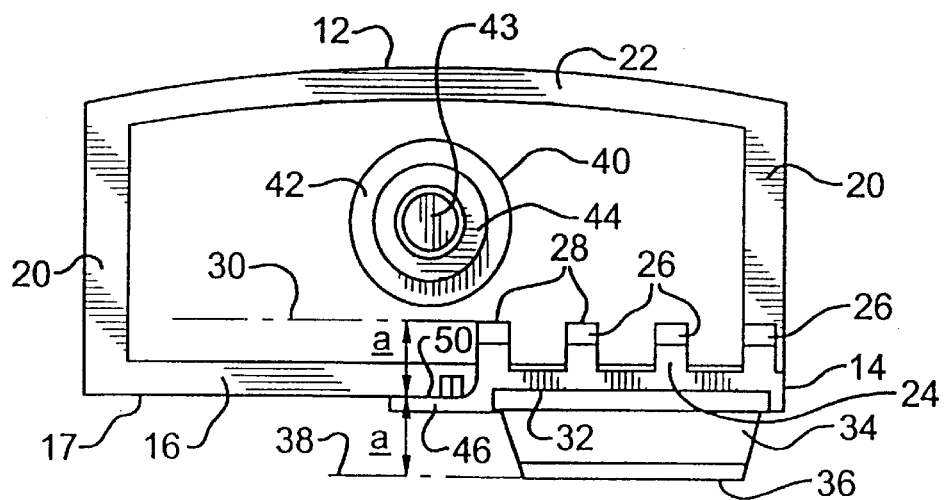
FIG. 5 is an elevational view of the unit of FIG. 1.

As best seen in FIGS. 1 and 5, the inner panel 14 is in the form of an approximately rectangular plate 24 which integrally supports four elongate, spaced-apart bars 26, each having a flat top surface 28. The flat surfaces 28 are coplanar and define what will be called a "first contact plane 30" in this disclosure.

A dot-dash line in FIG. 5 indicates the position of the first contact plane 30.

It will be realized from what follows that the bars 26 represent only one of several possible designs, any one of which could fulfill the purpose of defining the first contact plane 30. For example, the interstitial space between adjacent bars 26 could be filled with material.

Turning again to FIG. 5, the inner panel 14 has a recess 32 which receives a pad 34 which, in the illustrated embodiment, is in the form of a conical frustum and defines a pad surface 36 which lies in a plane which will be designated hereinafter as the second contact plane 38. A dot-dash line in FIG. 5 indicates the position of this contact plane.

Figure 2:
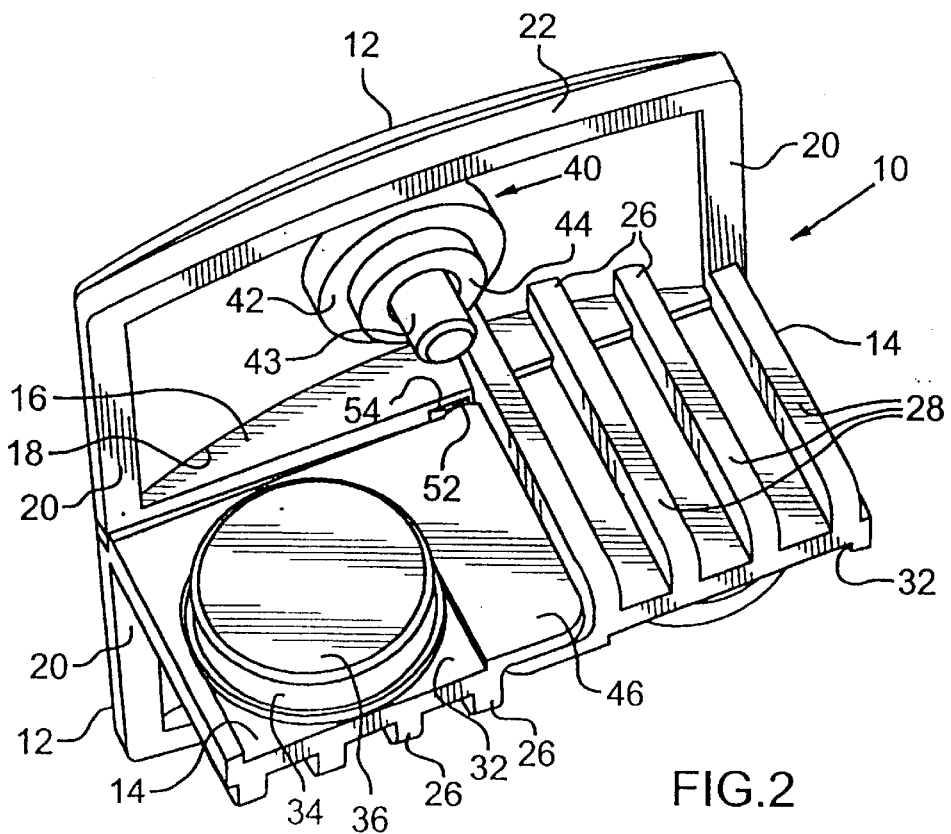
FIG. 2 is a perspective view of two units identical to the one unit shown in FIG. 1, locked together to provide an interstitial spacer.

Attention is directed to FIGS. 1, 2 and 5, which illustrate generally at 40 the inside view of a recess allowing the outer panel 12 of the support unit 10 to be secured to a stacked item with the inner panel 14 in contact with the same stacked item. More particularly, the recess 40 has the form of a countersunk hole 42 for receiving the head (not illustrated) of a threaded fastener 43 which attaches the support unit 10 to one of the items mentioned earlier. A concentric boss 44 has a face 45 intended to contact the surface of an enclosure.

As best seen in FIGS. 1 and 5, the support unit 10 further includes a flange 46 which is adjacent the mid-region of the outer panels 12, and which extends generally parallel with the first and second contact planes 30 and 38. Preferably, the flange 46 is integral with the inner panel. Whether integral or not, the flange 46 is contiguous with and supported by the inner panel 14, as best seen in FIGS. 1 and 5.

More particularly, the flange 46 is substantially flat, and has a top surface 48 which contains a hypothetical line 50 extending at right angles to the outer panel 12. The structure of the support unit 10 is such that a pair of similar or identical support units, with one of them rotated about the hypothetical line through 180° with respect to the other, can be fitted together with the hypothetical lines 50 coincident, with the flanges in surface contact, with the lower edges of the outer panels in aligned contact, and with the first contact plane of each support unit 10 coplanar with the second contact plane of the other support unit. This means that a single support unit alone can provide a load-bearing foot with which to support at least part of the overall weight of a stack of items (such as electrical housings or enclosures), while a pair of support units 10 in rotated juxtaposition about their said hypothetical lines 50 (as defined above) can provide an interstitial spacer between two stacked items, with each support unit attached to its respective item by way of the respective securement means 40.

As best seen in FIG. 5, the hypothetical line 50 is substantially equidistant from the first and second contact planes 30 and 38. These two distances are identified by the letter a in FIG. 5.

Attention is again directed to FIGS. 1, 2 and 5, which show that the flat flange 46 has a first detent means 52 in the form of a triangular protuberance pointing toward the outer panel 12, whereas the outer panel 12 has a second detent means 54 in the form of a triangular protuberance pointing away from the outer panel 12. The detents 52, 54 are such that, when a pair of the support units 10 are in rotational juxtaposition about their coinciding hypothetical lines 50, the first detent means 52 of each support unit 10 interlocks with the second detent means 54 of the other support unit 10, to restrain the pair of support units from disengaging. Engagement is shown in FIG. 2.

Figure 3:
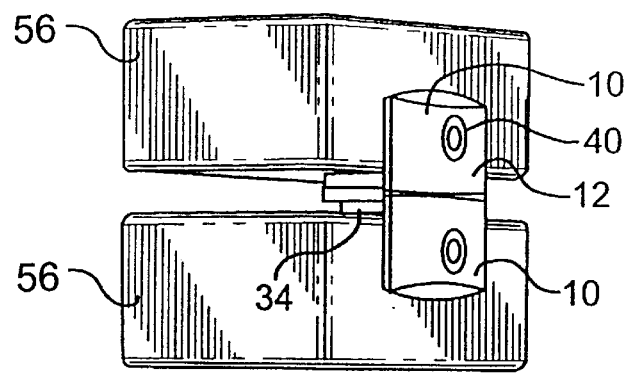
FIG. 3 is a perspective view of two stack enclosures utilizing the interstitial spacer of the present design, viewed from a level even with the interstitial space.
Figure 4:
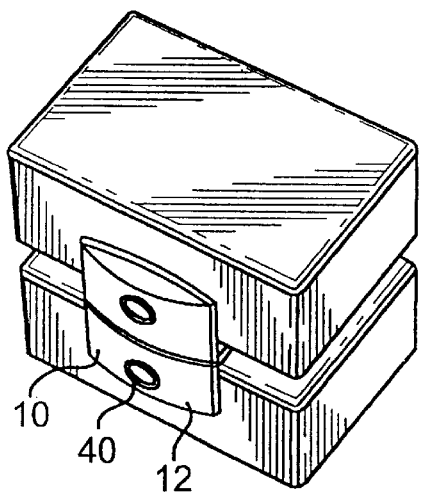
FIG. 4 is a view of the components of FIG. 3, as seen obliquely from above.

FIG. 3 illustrates two stacked enclosures 56 maintained apart and held in relative position by a pair of the support units 10, while FIG. 4 shows the FIG. 3 structure from a different angle.

While one embodiment of this invention has been illustrated in the accompanying drawings and described hereinabove, it will be evident to those skilled in the art that changes and modifications may be made therein, without departing from the essence of this invention, as set forth in the appended claims.

What is claimed is:

1. A support unit for providing a space between a pair of stacked items, the support unit comprising:

(a) an outer panel adapted to lie substantially in a vertical plan when in use, the outer panel having a substantially straight, horizontal lower edge having a first end and a second end, (b) an inner panel extending generally at a right-angle relative to the outer panel and being connected thereto along a portion of said horizontal lower edge, the inner panel being adjacent to the first end of the horizontal lower edge and having a first edge and a second edge extending at a right angle relative to the outer panel, the second edge being spaced from the first end of the horizontal lower edge of the outer panel, the inner panel having a first horizontal contact plane on an upper side of the inner panel, and a second horizontal contact plane on a lower side of the inner panel, each of the planes being substantially parallel to one another, said first horizontal contact plane for abutting a bottom wall of a first of the pair of stacked items; and (c) a flange extending from the second edge of said inner panel and being generally parallel with said first and second horizontal contact planes, wherein the outer panel includes securing means for securing the outer panel to a stacked item with the inner panel contacting the same stacked item; the support unit for mating with another support unit by rotating the other support unit 180 degrees with respect to the support unit such that the flange of the support unit and a flange of the other support unit are in surface contact, the lower edge of the outer panel of the support unit and a lower edge of an outer panel of the other support unit are in aligned contact, and the first horizontal contact plane of the support unit is coplanar with a second contact plane of the other support unit; whereby a single support unit alone provides a load-bearing foot with which to support at least a portion of the overall weight of a stack of said items, while a pair of support units in rotated juxtaposition provides an interstitial spacer between two stacked items, with each support unit attached to its respective item.

2. The support unit claimed in claim 1, in which the securing means is a countersunk opening through which a fastener can be passed to attach the support unit to the stacked item.

3. The support unit claimed in claim 1, in which the flange is contiguous with and supported by the inner panel.

4. The support unit claimed in claim 1, in which the flange is substantially flat and has a top surface which extends in a direction at a right angle to the outer panel, said top surface being located substantially mid-way between said first and second contact planes.

5. The support unit claimed in claim 4, in which the flange includes a first detent and the outer panel includes a second detent, the first and second detents being such that, when a pair of the support units are in rotational juxtaposition, the first detent of the support unit interlocks with the second detent of the other support unit to restrain the pair of support units from disengaging.

\* \* \* \* \*